United States Patent
Suzuki et al.

(10) Patent No.: US 9,470,970 B2
(45) Date of Patent: Oct. 18, 2016

(54) MASK BLANK, TRANSFER MASK, AND METHODS OF MANUFACTURING THE SAME

(71) Applicant: HOYA CORPORATION, Shinjuku-ku, Tokyo (JP)

(72) Inventors: Toshiyuki Suzuki, Tokyo (JP); Shigenori Ishihara, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 57 days.

(21) Appl. No.: 14/385,205

(22) PCT Filed: Feb. 8, 2013

(86) PCT No.: PCT/JP2013/053053
§ 371 (c)(1),
(2) Date: Sep. 15, 2014

(87) PCT Pub. No.: WO2013/140887
PCT Pub. Date: Sep. 26, 2013

(65) Prior Publication Data
US 2015/0072273 A1     Mar. 12, 2015

(30) Foreign Application Priority Data
Mar. 23, 2012  (JP) ................ 2012-066742

(51) Int. Cl.
G03F 1/26  (2012.01)
G03F 1/32  (2012.01)
G03F 1/38  (2012.01)
G03F 1/54  (2012.01)

(52) U.S. Cl.
CPC . G03F 1/26 (2013.01); G03F 1/32 (2013.01); G03F 1/38 (2013.01); G03F 1/54 (2013.01)

(58) Field of Classification Search
CPC .......................................................... G03F 1/26
USPC ............................................................. 430/5
See application file for complete search history.

(56) References Cited

U.S. PATENT DOCUMENTS 6,171,104 B1    1/2001  Yukimasa
2002/0058186 A1  5/2002  Nozawa et al.
(Continued)

FOREIGN PATENT DOCUMENTS

JP  2000-058543 A  2/2000
JP  2002-090978 A  3/2002
(Continued)

OTHER PUBLICATIONS

International Search Report for PCT/JP2013/053053 dated Apr. 16, 2013.

Primary Examiner — Stephen Rosasco
(74) Attorney, Agent, or Firm — Sughrue Mion, PLLC

(57) ABSTRACT

This invention provides a mask blank in which a thin film for transfer pattern formation is provided on a main surface of a transparent substrate. The thin film is made of a material containing a transition metal and silicon and further containing at least one of oxygen and nitrogen. The thin film has as its surface layer an oxide layer with an oxygen content higher than that of a region, other than the surface layer, of the thin film. The thin film is formed so that the thickness of its central portion is greater than that of its outer peripheral portion on the main surface side. The oxide layer is formed so that the thickness of its central portion is greater than that of its outer peripheral portion on the main surface side.

6 Claims, 3 Drawing Sheets

(56) References Cited

U.S. PATENT DOCUMENTS

| | | |
|---|---|---|
| 2002/0061452 A1 | 5/2002 | Nozawa et al. |
| 2002/0086220 A1 | 7/2002 | Nozawa et al. |
| 2003/0180630 A1 | 9/2003 | Shiota et al. |
| 2007/0092808 A1 | 4/2007 | Shiota et al. |
| 2010/0040961 A1 | 2/2010 | Shiota et al. |
| 2013/0101926 A1* | 4/2013 | Jang .................. G03F 1/26 430/5 |

FOREIGN PATENT DOCUMENTS

| | | |
|---|---|---|
| JP | 2002-162726 A | 6/2002 |
| JP | 2003-248291 A | 9/2003 |
| JP | 2004-318184 A | 11/2004 |
| JP | 2005-062894 A | 3/2005 |
| JP | 2006-323236 A | 11/2006 |
| JP | 2010-250344 A | 11/2010 |
| JP | 2013-257544 A | 12/2013 |

* cited by examiner

MASK BLANK, TRANSFER MASK, AND METHODS OF MANUFACTURING THE SAME

CROSS REFERENCE TO RELATED APPLICATIONS

This application is a National Stage of International Application No. PCT/JP2013/053053 filed Feb. 8, 2013, claiming priority based on Japanese Patent Application No. 2012-066742, filed Mar. 23, 2012, the contents of all of which are incorporated herein by reference in their entirety.

TECHNICAL FIELD

This invention relates to a mask blank, a transfer mask, methods of manufacturing them, and so on.

BACKGROUND ART

Conventionally, there has been widely known a mask blank comprising a halftone phase shift film (hereinafter referred to as a phase shift film) made of MoSiN, MoSiON, or the like. In the manufacture of such a mask blank, it is usual to form a phase shift film on a main surface of a transparent substrate using a single-wafer sputtering apparatus. In a normal single-wafer sputtering apparatus, a rotary stage on which a transparent substrate is to be placed is provided in the lower part of a film forming chamber and a target is disposed directly above the rotary stage. However, in the case where the normal single-wafer sputtering apparatus is used in the formation of the halftone phase shift film, there has been a problem that the thickness of the film on the outer peripheral side of the main surface of the transparent substrate tends to be relatively small compared to that on the center side thereof due to a shape of the main surface of the transparent substrate being rectangular. The phase shift film is required to simultaneously achieve a function of transmitting exposure light at a predetermined transmittance and a function of producing a predetermined phase difference between the exposure light transmitted therethrough and exposure light transmitted in air for a distance equal to the thickness of the phase shift film. If there is non-uniformity in the thickness distribution in the plane of the formed phase shift film, there is a possibility of the occurrence of variation in transmittance distribution in the plane or the occurrence of variation in phase difference distribution in the plane. When a phase shift film of a material containing oxygen or nitrogen is formed on a transparent substrate by DC sputtering using as a target material a material containing silicon such as MoSiN or MoSiON, since a nitride of silicon or an oxide of silicon has low conductivity, particles due to charge-up tend to be produced on a target surface. There is a possibility that these particles fall onto the transparent substrate located directly below the target surface and enter the phase shift film, thereby forming defects. That is, there is also a problem that the defect occurrence ratio increases.

In order to solve the unique problems that arise when such a rectangular mask blank film is formed by sputtering, use is made of a single-wafer sputtering apparatus disclosed in JP-A-2002-090978 (Patent Literature 1). In this sputtering apparatus, a target is disposed obliquely above a rotary stage, on which a transparent substrate is to be placed, so that both horizontal and vertical distances are ensured between the transparent substrate and the target (see FIG. 2). By forming a phase shift film on the transparent substrate using the sputtering apparatus of such a structure (sputtering apparatus of a so-called oblique-incidence sputtering type), it is possible to prevent the thickness of the film on the center side of the substrate from becoming relatively large and further to reduce defects due to charge-up of a target surface.

On the other hand, there has been a problem that when a transfer mask is manufactured from a mask blank having a thin film made of a material containing a metal and silicon, such as MoSiN or MoSiON, the light resistance of the thin film is not so high to exposure light irradiated onto the transfer mask. Further, the resistance is also not so high to a chemical liquid for use in a process of manufacturing the transfer mask from the mask blank or to a cleaning liquid for use in cleaning which is carried out for the completed transfer mask. Further, the thin film of this material tends to have a relatively large compressive stress. In order to solve these problems, for example, as disclosed in JP-A-2002-162726 (Patent Literature 2), a heat treatment is applied to a glass substrate formed with a light-semitransmissive film containing a metal, silicon, and nitrogen.

On the other hand, by applying a heat treatment in air or in a gas containing oxygen to a mask blank comprising a light-semitransmissive film containing a metal, silicon, and nitrogen, the light resistance can be improved. In the case where the heat treatment is applied to this mask blank, there has been a problem that if the mask blank is naturally cooled after the heat treatment, the in-plane variation in the optical properties of the light-semitransmissive film increases. In order to solve this problem, for example, as disclosed in JP-A-2006-323236 (Patent Literature 3), a treatment is carried out to forcibly cool a mask blank immediately after a heat treatment by the use of cooling means.

RELATED ART DOCUMENT(S)

Patent Literature(s)

Patent Literature 1: JP-A-2002-090978
Patent Literature 2: JP-A-2002-162726
Patent Literature 3: JP-A-2006-323236

SUMMARY OF INVENTION

Problem to be Solved by the Invention

When a heat treatment is applied in air or in a gas containing oxygen to a thin film (light-semitransmissive film or the like) made of a material containing a transition metal, silicon, and nitrogen, oxygen is taken in through a surface of the thin film so that a layer (oxide layer) with an oxygen concentration higher than that of the other region of the film is formed. When the heat treatment and further a forcible cooling treatment are carried out for the thin film, the uniformity of the thickness distribution in the plane of the oxide layer of the thin film can be enhanced by so-called single-wafer processing which carries out the treatments per single mask blank, and as a result, the in-plane variation in the optical properties of the thin film after the treatments can be made smaller. However, in consideration of the throughput, so-called batch processing is preferable which processes a plurality of mask blanks at a time. When a heat treatment is carried out in a batch manner for a plurality of mask blanks, for example, a vertical furnace disclosed in FIG. 5 of Patent Literature 2 is used as a heating apparatus.

This vertical furnace is configured such that a quartz board is provided in a quartz tube. A plurality of mask blanks are placed on the quartz board so that the plurality of mask blanks are arranged so as to be stacked vertically at a predetermined interval from each other in the quartz tube. In the state where the mask blanks are disposed in this manner, a heat treatment is carried out by a heater disposed around the quartz tube. In this event, since the heater is located on the end face sides (outer peripheral sides) of the mask blanks, the heat from the heater is applied to the mask blanks from their outer peripheral sides. In the case where the mask blanks are cooled by natural cooling after the completion of the heat treatment, since remaining heat from the quartz tube is applied much to the outer peripheral sides of the mask blanks, the mask blanks are difficult to cool. Further, in the case of the natural cooling, oxygen is taken in through surfaces of thin films while the surface temperature of the thin films is gradually lowered. Therefore, the take-in amount of oxygen largely varies in the plane of the surface of each thin film so that the variation in the thickness distribution in the plane of an oxide layer of each thin film tends to occur. From these, when the plurality of mask blanks are heat-treated using the vertical furnace and then the natural cooling method is applied thereto, it has been difficult to suppress the variation in the optical properties of each thin film.

In view of this, the present inventors have intensively studied a vertical furnace which, when it is used for a heat treatment of mask blanks, can carry out a forcible cooling treatment subsequently to the heat treatment. As a result, the present inventors have found a structure of a vertical furnace 100 shown in FIG. 3. The vertical furnace 100 of FIG. 3 largely differs from the vertical furnace disclosed in Patent Literature 2 in that the vertical furnace 100 has a function (cooler) that can forcibly cool an inner tube 10B by introducing a coolant into a space between an inner wall of an outer tube 10A and an outer wall of the inner tube 10B in a quartz tube 10 of a two-layer structure. With this function, it is possible to forcibly cool a gas and mask blanks 5 in a heating/cooling chamber 17 (in the furnace) as an inner space of the inner tube 10B. A coolant inlet pipe 11 and a coolant outlet pipe 12 for introducing and discharging the coolant into and from the space are provided at upper and lower portions of the outer tube 10A. Further, the vertical furnace 100 comprises a gas inlet pipe 13 and a gas outlet pipe 14 for introducing and discharging a gas (air, gas containing oxygen, or the like), to which the mask blanks 5 are exposed in a heat treatment, into and from the heating/cooling chamber 17. A heater (heating apparatus) 15 for use in heat-treating the mask blanks 5 is provided around the outer tube 10A. Further, a quartz board 16 for placing thereon the plurality of mask blanks 5 is disposed in the furnace.

By the use of the vertical furnace 100 described above, it is possible to carry out a heat treatment and a forcible cooling treatment for the plurality of mask blanks 5 in a batch manner. However, it has been found that even if such batch-type heat treatment and forcible cooling treatment are carried out, it is difficult to suppress the in-plane variation in the optical properties of the thin films of the mask blanks 5 after the treatments. The vertical furnace 100 is configured such that when the forcible cooling treatment is carried out, the inner tube 10B of the quartz tube 10 is cooled by the coolant and further the gas in the heating/cooling chamber 17 is cooled through the inner wall of the inner tube 10B. Since the plurality of mask blanks 5 are each disposed horizontally, first, the end face sides (outer peripheral sides) of the mask blanks (thin films) 5 are forcibly cooled. Accordingly, each of the thin films 4 is forcibly cooled from its end face side toward its center side in order. The thin film 4 takes in much oxygen in a state where its surface temperature is a predetermined temperature or higher, but the take-in amount of oxygen is significantly reduced when the surface temperature of the thin film 4 is rapidly lowered.

FIG. 4 shows a cross section of a mask blank 5 after a heat treatment and a forcible cooling treatment were carried out using the vertical furnace 100. The mask blank 5 is such that a thin film 4 made of a material containing a transition metal, silicon, and nitrogen is formed on a transparent substrate 1 under conditions where the uniformity of the thin film thickness on a main surface of the transparent substrate 1 becomes high, using the sputtering apparatus of the oblique-incidence sputtering type shown in FIG. 2 in a process of forming the thin film 4. That is, a thickness $H_{c4}$ of a central portion (region on the center side) of the thin film 4 and a thickness $H_{o4}$ of an outer peripheral portion (region on the outer peripheral side) of the thin film 4 are approximately equal to each other. As described above, the mask blank 5 was subjected to the heat treatment and the forcible cooling treatment in the vertical furnace 100 after the formation of the thin film 4. In the mask blank 5 after those treatments, the thickness of an oxide layer 42 is relatively small at the outer peripheral portion of the thin film 4 while the thickness of the oxide layer 42 is relatively large at the central portion of the thin film (the thickness of a region 41, other than the oxide layer 42, of the thin film 4 is relatively large at its outer peripheral portion while the thickness thereof is relatively small at its central portion). That is, a thickness $H_{c42}$ of a central portion of the oxide layer 42 is greater than a thickness $H_{o42}$ of an outer peripheral portion of the oxide layer 42 (a thickness $H_{c41}$ of a central portion of the region 41, other than the oxide layer 42, of the thin film 4 is smaller than a thickness $H_{o41}$ of an outer peripheral portion thereof). Herein, in FIG. 4, a square shape with a side of a predetermined length is defined with respect to the center of the transparent substrate 1, wherein a region inside the square shape is given as a central portion while a region outside the square shape is given as an outer peripheral portion. For example, in the case of a transparent substrate having a square shape with a side of about 152 mm, which is the size of a mask blank widely used conventionally, the length of a side of the above-mentioned square shape may be set to, for example, 132 mm. The length of the side of the square shape is not limited thereto. Further, the shape of the boundary line between the central portion and the outer peripheral portion is not limited to the square shape.

Conventionally, it has been said to be preferable that the thickness of the thin film 4 provided on the transparent substrate 1 in the mask blank 5 be as uniform as possible on the main surface of the transparent substrate 1. Further, it has also been said to be preferable that the composition of the thin film 4 be as uniform as possible on the main surface. Accordingly, the conditions of a film forming apparatus for forming the thin film 4 are set so as to more approach uniform film thickness distribution and uniform film composition distribution, thereby carrying out a thin film forming process. Consequently, the uniformity of the transmittance distribution, on the main surface, of the thin film 4 before the heat treatment and the forcible cooling treatment is high. The oxide layer 42 formed as a surface layer of the thin film 4 after the heat treatment and the forcible cooling treatment is made of a material with a transmittance significantly higher than that of the material of the region 41, other than the oxide layer 42, of the thin film. In the mask blank 5, since the uniformity of the thickness distribution of the oxide layer 42 is low, the uniformity of the in-plane transmittance distribution of the entire thin film 4 is also low (in-plane variation is large). When the thin film 4 is a phase shift film not only having a predetermined transmittance, but also having a function of producing a phase shift of a predetermined amount for exposure light transmitted therethrough, particularly high uniformity is required also for the phase shift amount distribution on the main surface. Therefore, when the thin film 4 is the phase shift film, a problem particularly arises. Further, when exposure light irradiated onto a transfer mask manufactured from the mask blank 5 having this thin film 4 is short-wavelength ArF excimer laser, a problem arises because the influence appears significantly.

Means for Solving the Problem

The present inventors have made intensive studies in order to solve the above-mentioned technical problems. First, it has been found that when a heat treatment and a forcible cooling treatment are carried out for thin films of a plurality of mask blanks in a batch manner using the vertical furnace 100, it is difficult to make uniform the thickness distribution of an oxide layer formed as a surface layer of each thin film. Therefore, on the assumption that the oxide layer, according to its thickness distribution, is thick at a central portion of a main surface and thin at an outer peripheral portion thereof, the present inventors have attempted to make an adjustment at a stage of a thin film forming process so that the transmittance distribution of the thin film after the formation of the oxide layer becomes uniform. First, the present inventors have intensively studied film forming conditions capable of achieving the composition of the thin film that provides low transmittance at its central portion and high transmittance at its outer peripheral portion. However, it has been found that it is difficult to take control so that such a transmittance distribution is already achieved in the process of forming the thin film. Then, the present inventors have intensively studied to enhance the uniformity of the transmittance distribution of the thin film after the formation of the oxide layer by means of the thickness distribution of the thin film when it is formed. As a result, it has been found that if the thin film is formed thick at its central portion and thin at its outer peripheral portion in the process of forming the thin film, even if a heat treatment and a forcible cooling treatment are carried out in a batch manner in a later process, it is possible to enhance the in-plane uniformity of the transmittance distribution of the thin film after the formation of the oxide layer finally.

This invention has been made as a result of the intensive studies by the present inventors described above and has the following structures.

(Structure 1)

A mask blank comprising a thin film for transfer pattern formation on a main surface of a transparent substrate, wherein the thin film is made of a material containing a transition metal and silicon and further containing at least one of oxygen and nitrogen, wherein the thin film has as its surface layer an oxide layer with an oxygen content higher than that of a region, other than the surface layer, of the thin film, wherein the thin film is formed so that a thickness of its central portion is greater than that of its outer peripheral portion on the main surface side, and wherein the oxide layer is formed so that a thickness of its central portion is greater than that of its outer peripheral portion on the main surface side.

(Structure 2)

The mask blank according to Structure 1, wherein the thin film is a semitransmissive film having a transmittance of 1% or more for exposure light.

(Structure 3)

The mask blank according to Structure 1, wherein the thin film is a halftone phase shift film having a transmittance of 1% or more for exposure light and adapted to produce a phase difference between exposure light transmitted through the thin film and exposure light transmitted in air for a distance equal to the thickness of the thin film.

(Structure 4)

The mask blank according to Structure 2 or 3, wherein the thin film is such that an in-plane distribution of the transmittance is in a range of 0.6%.

(Structure 5)

The mask blank according to Structure 3, wherein the thin film is such that an in-plane distribution of the phase difference is in a range of 4 degrees.

(Structure 6)

A method of manufacturing a mask blank comprising a thin film for transfer pattern formation on a main surface of a transparent substrate, comprising:

a thin film forming step of forming, on the main surface of the transparent substrate, the thin film by sputtering using a target containing a transition metal and silicon in a sputtering gas containing at least one of oxygen and nitrogen; and a heating/cooling step of carrying out, in a gas containing oxygen, a heat treatment and a forcible cooling treatment for the thin film formed in the thin film forming step, wherein the thin film forming step is a step of forming the thin film so that a thickness of its central portion is greater than that of its outer peripheral portion on the main surface side, and wherein the heating/cooling step is a step of forming, as a surface layer of the thin film, an oxide layer with an oxygen content higher than that of a region, other than the surface layer, of the thin film and is a step of forming the oxide layer so that a thickness of its central portion is greater than that of its outer peripheral portion on the main surface side.

(Structure 7)

The method of manufacturing a mask blank according to Structure 6, wherein the heating/cooling step is a step of disposing a plurality of the transparent substrates, each formed with the thin film, so as to be stacked vertically at an interval from each other with their main surfaces facing vertically in a heating/cooling chamber, thereby carrying out the heat treatment and the forcible cooling treatment using a heater and a cooler which are disposed on end face sides of the transparent substrates outside the heating/cooling chamber.

(Structure 8)

The method of manufacturing a mask blank according to Structure 7, wherein the heating/cooling step is a step of carrying out the forcible cooling treatment by the cooler when a temperature in the heating/cooling chamber is 300° C. or more after carrying out the heat treatment by the heater.

(Structure 9)

The method of manufacturing a mask blank according to any of Structures 6 to 8, wherein the thin film forming step is a step of rotating the transparent substrate about a rotation axis passing through a center of the main surface and disposing a sputtering surface of the sputtering target at a position facing the main surface of the transparent substrate and having an angle with respect to the main surface so that the rotation axis of the transparent substrate and a straight line passing through a center of the sputtering surface and parallel to the rotation axis of the transparent substrate are offset from each other, thereby forming the thin film by the sputtering.

(Structure 10)

The method of manufacturing a mask blank according to any of Structures 6 to 9, wherein the thin film is a semi-transmissive film having a transmittance of 1% or more for exposure light.

(Structure 11)

The method of manufacturing a mask blank according to any of Structures 6 to 9, wherein the thin film is a halftone phase shift film having a transmittance of 1% or more for exposure light and adapted to produce a phase difference between exposure light transmitted through the thin film and exposure light transmitted in air for a distance equal to the thickness of the thin film.

(Structure 12)

The method of manufacturing a mask blank according to Structure 10 or 11, wherein the thin film is such that an in-plane distribution of the transmittance is in a range of 0.6%.

(Structure 13)

The method of manufacturing a mask blank according to Structure 11, wherein the thin film is such that an in-plane distribution of the phase difference is in a range of 4 degrees.

(Structure 14)

A transfer mask, wherein the thin film of the mask blank according to any of Structures 1 to 5 is formed with a transfer pattern.

(Structure 15)

A method of manufacturing a transfer mask, comprising a pattern forming step of forming a transfer pattern in the thin film of the mask blank manufactured by the method of manufacturing a mask blank according to any of Structures 6 to 13.

Advantageous Effects of Invention

According to this invention, in a mask blank comprising a thin film having as its surface layer an oxide layer, even if the oxide layer is formed thicker at its central portion than at its outer peripheral portion, the uniformity of the optical properties such as transmittance of the entire thin film on the main surface side can be set within a predetermined allowable range. Further, even if, as a result of carrying out a heat treatment and a forcible cooling treatment for a mask blank comprising a thin film, an oxide layer is formed as a surface layer of the thin film, the uniformity of the optical properties such as transmittance of the entire thin film including the surface layer, on a main surface, can be set within a predetermined allowable range.

MODE FOR CARRYING OUT THE INVENTION

Hereinafter, this invention will be described in detail.

A mask blank according to this invention is a mask blank comprising a thin film for transfer pattern formation on a main surface of a transparent substrate, as described in structure 1, wherein the thin film is made of a material containing a transition metal and silicon and further containing at least one of oxygen and nitrogen, wherein the thin film has as its surface layer an oxide layer with an oxygen content higher than that of a region, other than the surface layer, of the thin film, wherein the thin film is formed so that a thickness of its central portion is greater than that of its outer peripheral portion on the main surface side, and wherein the oxide layer is formed so that a thickness of its central portion is greater than that of its outer peripheral portion on the main surface side.

Further, a method of manufacturing a mask blank according to this invention is a method of manufacturing the mask blank comprising a thin film for transfer pattern formation on a main surface of a transparent substrate, wherein the method comprises:

a thin film forming step of forming, on the main surface of the transparent substrate, the thin film by sputtering using a target containing a transition metal and silicon in a sputtering gas containing at least one of oxygen and nitrogen; and a heating/cooling step of carrying out, in a gas containing oxygen, a heat treatment and a forcible cooling treatment for the thin film formed in the thin film forming step, wherein the thin film forming step is a step of forming the thin film so that a thickness of its central portion is greater than that of its outer peripheral portion on the main surface side, and wherein the heating/cooling step is a step of forming, as a surface layer of the thin film, an oxide layer with an oxygen content higher than that of a region, other than the surface layer, of the thin film and is a step of forming the oxide layer so that a thickness of its central portion is greater than that of its outer peripheral portion on the main surface side.

Figure 1:
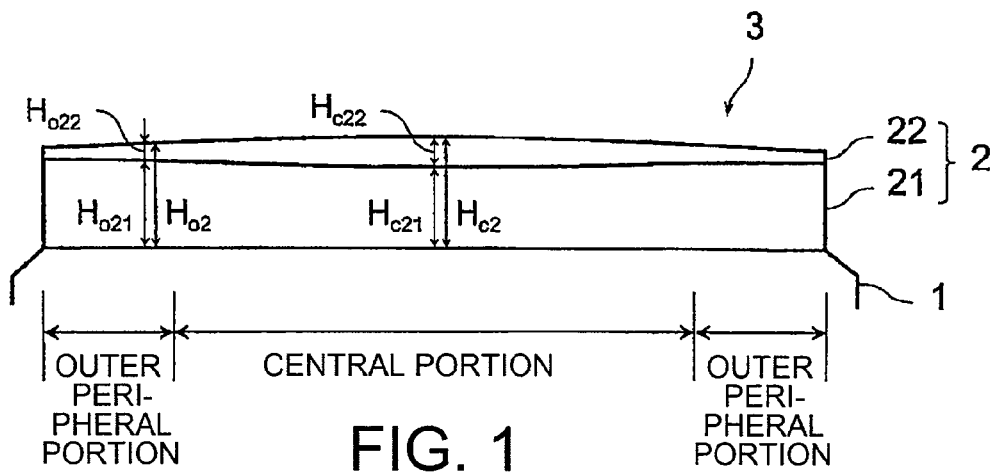
FIG. 1 is an exemplary cross-sectional view of a mask blank in an embodiment of this invention.

In this invention, the thin film has as its surface layer the oxide layer with the oxygen content higher than that of the region, other than the surface layer, of the thin film. As shown in FIG. 1, this mask blank 3 is configured such that a thin film 2 for transfer pattern formation is provided on a main surface of a transparent substrate 1. The thin film 2 has as its surface layer an oxide layer 22 with an oxygen content higher than that of a region 21, other than the surface layer, of the thin film. Further, the thin film 2 is formed so that the thickness of its central portion is greater than that of its outer peripheral portion on the main surface side. As shown in FIG. 1, the thin film 2 is formed so that a thickness $H_{c2}$ of its central portion is greater than a thickness $H_{o2}$ of its outer peripheral portion on the main surface side. Specifically, the thickness of the thin film 2 increases toward its central portion from its outer peripheral portion.

Herein, also in FIG. 1, a square shape with a side of a predetermined length is defined with respect to the center of the transparent substrate 1, wherein a region inside the square shape is given as a central portion while a region outside the square shape is given as an outer peripheral portion. For example, in the case of a transparent substrate having a square shape with a side of about 152 mm, which is the size of a mask blank widely used conventionally, the length of a side of the above-mentioned square shape may be set to, for example, 132 mm or 142 mm. The length of the side of the square shape is not limited thereto. Further, the shape of the boundary line between the central portion and the outer peripheral portion is not limited to the square shape. In particular, the thickness $H_{c2}$ of the central portion of the thin film 2 is preferably a thickness measured at the center of the central portion of the thin film 2. Further, the thickness $H_{o2}$ of the outer peripheral portion of the thin film 2 is preferably a thickness measured at the outer peripheral portion of the thin film 2 near the boundary line with the inner peripheral portion thereof. Further, in the case where the boundary line has a square shape with a side of 132 mm, the thickness $H_{o2}$ of the outer peripheral portion of the thin film 2 is more preferably a thickness measured at the outer peripheral portion of the thin film 2 near a corner of the square shape.

The oxide layer 22 is formed so that the thickness of its central portion is greater than that of its outer peripheral portion on the main surface side. As shown in FIG. 1, the oxide layer 22 is formed so that a thickness $H_{c22}$ of its central portion is greater than a thickness $H_{o22}$ of its outer peripheral portion on the main surface side. Specifically, the thickness of the oxide layer 22 increases toward the central portion of the thin film 2 from the outer peripheral portion of the thin film 2. The thickness $H_{c22}$ of the central portion of the oxide layer 22 is preferably a thickness measured at the center of the thin film 2 on the main surface side. Further, the thickness $H_{o22}$ of the outer peripheral portion of the oxide layer 22 is preferably a thickness measured at the outer peripheral portion of the oxide layer 22 near the boundary line with the inner peripheral portion thereof. Further, in the case where the boundary line has a square shape with a side of 132 mm, the thickness $H_{o22}$ of the outer peripheral portion of the oxide layer 22 is more preferably a thickness measured at the outer peripheral portion of the thin film 2 near a corner of the square shape.

The thicknesses of the outer peripheral portion and the central portion of the thin film 2 on the main surface side and the thicknesses of the outer peripheral portion and the central portion of the oxide layer 22 on the main surface side are determined by the optical properties (transmittance for exposure light, phase shift amount to be given to exposure light, etc.) required for the thin film formed with a transfer pattern (thin film pattern) after manufacturing a transfer mask from the mask blank 3. On the assumption that the thin film 2 satisfies the required optical properties, the thickness distribution of the thin film 2 when it is formed on the transparent substrate 1 (the thickness $H_{o2}$ of the outer peripheral portion and the thickness $H_{c2}$ of the central portion of the thin film on the main surface side) is determined from the in-plane thickness distribution of the oxide layer 22 to be formed in the thin film 2 (a difference between the thickness $H_{o22}$ of the outer peripheral portion and the thickness $H_{c22}$ of the central portion of the oxide layer 22 on the main surface side) and the change amounts of the optical properties that change due to the formation of the oxide layer 22 in the thin film 2.

The thin film 2 for transfer pattern formation in this invention is made of a material containing a transition metal M and silicon (Si) and further containing at least one of oxygen (O) and nitrogen (N). In general, the oxide layer 22 formed as a surface layer of the thin film 2 made of such a material largely tends to be a layer with a high content of silicon and oxygen. Such an oxide layer 22 increases in transmittance (extinction coefficient k of a material decreases) and decreases in phase shift amount to be produced for exposure light transmitted therethrough (refractive index n of a material decreases) compared to the portion 21, other than the oxide layer 22, of the thin film. However, the oxide layer 22 attenuates exposure light transmitted therethrough to some degree and shifts the phase of exposure light transmitted therethrough to some degree. In order to enhance the uniformity of the transmittance distribution and the phase shift amount distribution of the entire thin film 2 on the main surface side, the influence by the oxide layer 22 cannot be ignored. Therefore, the thickness distribution of the thin film 2 that is first formed on the transparent substrate 1 should be determined in consideration of the thickness distribution of the oxide layer 22 that is formed as a surface layer of the thin film 2 in a later step and the influence that is exerted on the transmittance and the phase shift amount by the oxide layer 22. Thus, it is not satisfactory that the thickness distribution of the thin film is simply selected so that, after the formation of the oxide layer, a thickness ($H_{o21}$) of an outer peripheral portion and a thickness ($H_{c21}$) of a central portion of the region, other than the oxide layer, of the thin film become equal to each other. It is preferable that the thickness $H_{c21}$ of the central portion of the region 21, other than the oxide layer 22, of the thin film 2 be smaller than the thickness $H_{o21}$ of the outer peripheral portion of the region 21.

The oxide layer 22 does not include an oxide layer which is formed by natural oxidation or use in the form of a transfer mask (long-time irradiation of exposure light). In the case of an oxide layer that is formed by natural oxidation of the thin film 2 or that is formed in a thin film pattern in use in the form of a transfer mask (hereinafter referred to as an oxide layer due to natural oxidation or the like), there is a strong tendency that oxidation of a surface layer proceeds uniformly. Accordingly, the thickness uniformity of a formed surface layer is relatively high so that it hardly becomes the oxide layer 22 with the thickness distribution as in the invention according to the Structure 1 or 6. Therefore, taking into account only the oxide layer due to natural oxidation or the like, the need is low to change the thickness distribution on the main surface in a step of forming the thin film. With the structure of the thin film as in this invention when only the oxide layer due to natural oxidation or the like should be taken into account, there is, conversely, a possibility that the in-plane variation in optical properties may increase.

Although it depends on the relationship with the composition of the thin film 2, the transmittance of the thin film 2, the thickness of the thin film 2, and so on, the ratio between the thickness $H_{c2}$ of the central portion and the thickness $H_{o2}$ of the outer peripheral portion in the thin film 2 is, for example, preferably in a range of $H_{o2}/H_{c2}=0.94$ to 0.99 and more preferably in a range of $H_{o2}/H_{2}=0.95$ to 0.98. In this case, the ratio between the thickness $H_{c22}$ of the central portion and the thickness $H_{o22}$ of the outer peripheral portion in the oxide layer 22 is, for example, preferably in a range of $H_{o22}/H_{c22}=0.17$ to 0.88 and more preferably in a range of $H_{o22}/H_{c22}=0.25$ to 0.75. Further, the thickness of the oxide layer 22 is preferably 4 nm or less and more preferably 3 nm or less even at the thickest portion (central portion).

The thin film 2 for transfer pattern formation is made of a material containing a transition metal M and silicon (Si) and further containing at least one of oxygen (O) and nitrogen (N). As the transition metal M, there can be cited, for example, one of molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), palladium (Pb), and so on or an alloy thereof. The thin film 2 for transfer pattern formation may be made of a material containing, in addition to the above-mentioned component, carbon, hydrogen, an inert gas (helium, argon, xenon, or the like), or the like.

More specifically, as the thin film 2 for transfer pattern formation, there can be cited a transition metal silicide, a transition metal silicide nitride, a transition metal silicide oxynitride, a transition metal silicide oxide, or the like. The thin film 2 may have a single-layer structure or a multilayer structure. The thin film 2 may be configured to comprise an antireflection layer. The thin film 2 may be a composition gradient film.

The thin film 2 may be a semitransmissive film. The semitransmissive film may have a single-layer structure, a two-layer structure comprising a low-transmittance layer and a high-transmittance layer, or a multilayer structure.

The semitransmissive film may be of the high-transmittance type. The high-transmittance type has, for example, a relatively high transmittance of 10 to 30% while the transmittance is normally 1% to less than 10%.

The thin film 2 may be a semitransmissive film in a phase shift mask or an enhancer mask or a light-shielding film in a binary mask. Even in the light-shielding film of the binary mask, the phase difference is required to be reduced in terms of EMF bias and, for example, in the case where the in-plane phase difference distribution is strictly questioned, the invention of this application can be effectively applied thereto.

In this invention, the transition metal is preferably molybdenum. This is because, as described before, the thin film 2 made of a material such as MoSiN or MoSiON tends to have a relatively large compressive stress and a heat treatment is effective for reducing the compressive stress, and therefore, the subject of this application becomes particularly significant. As the thin film 2 for transfer pattern formation, there can be cited, for example, molybdenum silicide (MoSi), molybdenum silicide nitride (MoSiN), molybdenum silicide oxynitride (MoSiNO), molybdenum silicide oxide (MoSiO), molybdenum silicide carbonitride (MoSiCN), molybdenum silicide oxycarbide (MoSiOC), molybdenum silicide carboxynitride (MoSiOCN), or the like.

As described also in the Structure 6, the oxide layer 22 is preferably formed in the course of a heating/cooling step that carries out a heat treatment and a forcible cooling treatment for the thin film 2 in a gas containing oxygen. This is because the in-plane variation degree of the oxygen take-in amount in the thin film surface layer is easily controlled by forcibly and rapidly cooling the thin film 2 heated by the heat treatment.

In this invention, the oxide layer 22 is preferably formed by a heating/cooling step described in the Structure 6. This heating/cooling step carries out a heat treatment for the mask blank 3 having the thin film 2 in a gas containing oxygen and further carries out, before the mask blank 3 is naturally cooled, a forcible cooling treatment that forcibly cools the mask blank 3. The oxide layer 22 formed by the heating/cooling step becomes a film with a higher oxidation degree as the heating temperature of the heat treatment is set higher, so that the resistance to a cleaning liquid for use in a cleaning treatment in the manufacture of a mask blank, the resistance to a cleaning liquid for use in the process of manufacturing a transfer mask from this mask blank, and the resistance to a cleaning liquid for use in cleaning of the transfer mask respectively become high. In order to form the oxide layer 22 with various high cleaning resistances as a surface layer of the thin film 2 made of a material containing a transition metal and silicon, it is said to be necessary to carry out a heat treatment at a heating temperature of at least 300° C. or more. The heating temperature of the heat treatment for the thin film 2 is preferably 400° C. or more and more preferably 450° C. or more. On the other hand, in consideration of the influence on the transparent substrate 1, the heating temperature of the heat treatment for the thin film 2 is preferably 900° C. or less.

In order to achieve carrying out such a heating/cooling step simultaneously for a plurality of mask blanks 3, it is preferable that, as described in the Structure 7, the heating/cooling step be a step of disposing a plurality of transparent substrates 1, each formed with a thin film 2, so as to be stacked vertically at an interval from each other with their main surfaces facing vertically in a heating/cooling chamber and disposing a heater and a cooler on the end face sides (outer peripheral sides) of the transparent substrates 1 outside the heating/cooling chamber, thereby carrying out a heat treatment and a forcible cooling treatment. As a heating/cooling apparatus for achieving this step, there can be cited, for example, a vertical furnace 100 shown in FIG. 3. In the vertical furnace 100, a space inside an inner tube 10B of a quartz tube 10 serves as a heating/cooling chamber 17. A quartz board 16 (shelf made of quartz) is disposed in the heating/cooling chamber 17. The quartz board 16 is provided with substrate support portions 16A for allowing the transparent substrates 1 (mask blanks 3), each formed with the thin film 2, to be placed at an interval between their main surfaces facing each other. A gas inlet pipe 13 and a gas outlet pipe 14 are connected to the heating/cooling chamber 17. During the heating/cooling step, a gas containing oxygen (air or the like) is introduced through the gas inlet pipe 13 and discharged through the gas outlet pipe 14 so that the gas in the heating/cooling chamber 17 is constantly changing.

The quartz tube 10 has a double-pipe structure of an outer tube 10A and the inner tube 10B. A coolant inlet pipe 11 and a coolant outlet pipe 12 are connected to the outer tube 10A. By introducing and discharging a coolant into and from a space between an inner wall of the outer tube 10A and an outer wall of the inner tube 10B through the coolant inlet pipe 11 and the coolant outlet pipe 12, it is possible to forcibly cool the heating/cooling chamber 17 as an inner space of the inner tube 10B. That is, a cooler is formed by the quartz tube 10, the coolant inlet pipe 11, the coolant outlet pipe 12, and a non-illustrated coolant supply source. In terms of the positional relationship between the mask blanks 3 disposed on the quartz board 16 and the coolant, a forcible cooling treatment starts from the outer peripheral sides of the mask blanks 3. A heater 15 as a heating apparatus is provided around the outer tube 10A. In terms of the positional relationship between the mask blanks 3 disposed on the quartz board 16 and the heater 15, a heat treatment also starts from the outer peripheral sides of the mask blanks 3.

Preferably, the forcible cooling treatment in the heating/cooling step is carried out at least before the temperature of the thin films 2 of the mask blanks 3 subjected to the heat treatment falls, by natural cooling, to a temperature at which large variation occurs in the formation of oxide layers 22. As described in the Structure 8, the heating/cooling step is preferably a step of carrying out the forcible cooling treatment by the cooler when the temperature in the heating/cooling chamber 17 is 300° C. or more after carrying out the heat treatment by the heater. The step after carrying out the heat treatment referred to herein is not limited to a step immediately after stopping the heater as a heat source of the heat treatment and may alternatively be a step of starting forcible cooling by the cooler immediately before stopping the heater. For the heat treatment and the forcible cooling treatment for the thin films 2, it is preferable that the heater and the cooler be arranged so that heating and cooling proceed toward central portions of the thin films 2 from outer peripheral portions thereof. By arranging the heater and the cooler in this manner, the time interval from when the surface temperature of each thin film 2 reaches in the heat treatment a temperature (about 300° C.) at which the take-in rate of oxygen into the film largely increases compared to natural oxidation, until it falls in the forcible cooling treatment to a temperature at which the take-in rate of oxygen into the film largely decreases compared to natural oxidation, can be made longer at the central portion of the thin film 2 than at the outer peripheral portion thereof. By this, the thickness of the oxide layer 22 formed as a surface layer of each thin film 2 can be made greater at its central portion than at its outer peripheral portion on the main surface side.

In the heat treatment and in the forcible cooling treatment at least until the surface temperature of each thin film 2 falls to the temperature at which the take-in rate of oxygen into the film largely decreases, it is necessary that a gas containing oxygen be present around the thin films 2 of the mask blanks 3. The gas containing oxygen may be air and is preferably dry air having passed through a chemical filter.

As described in the Structure 6, the thin film forming step is preferably a step of forming, on the main surface of the transparent substrate 1, the thin film 2 by sputtering using a target containing a transition metal and silicon in a sputtering gas containing at least one of oxygen and nitrogen. Since it is desirable that the uniformity of the composition of the thin film 2 on the main surface side be high before the heating/cooling step, it is preferable to form the thin film 2 by a single-wafer sputtering apparatus. In this invention, while the thickness distribution of the thin film 2 on the main surface side should be controlled, it is controlled not to be uniform and conversely the thickness of the outer peripheral portion is made relatively small. Therefore, it is also possible to use a single-wafer sputtering apparatus configured such that a target surface is disposed directly above, in a face-to-face manner, the main surface, on the side where the thin film 2 is to be formed, of the transparent substrate 1.

Figure 2:
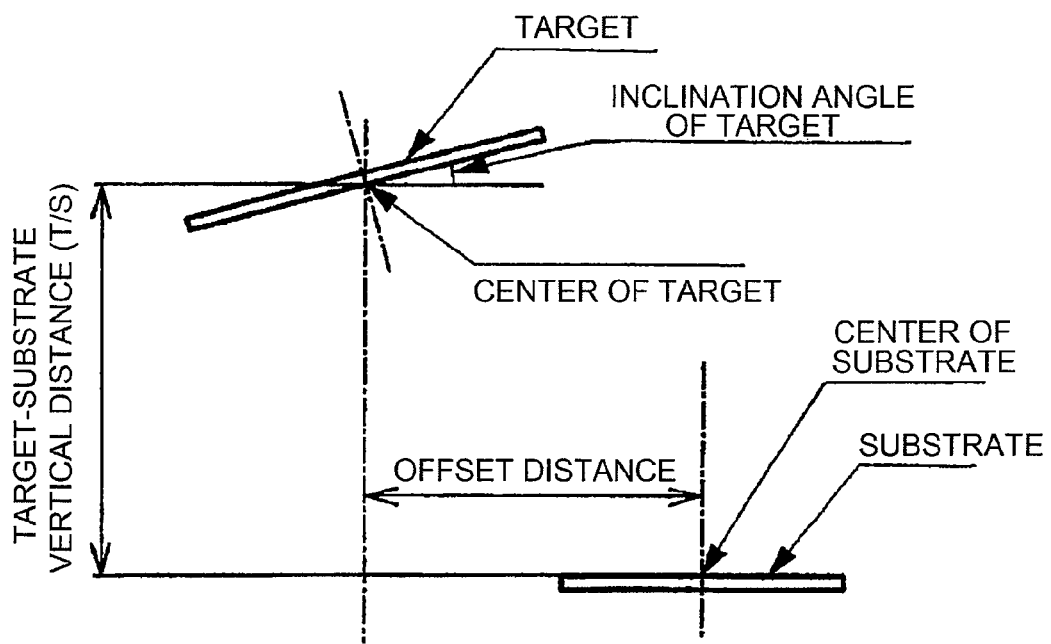
FIG. 2 is an exemplary diagram of a sputtering apparatus for use in a thin film forming step.

On the other hand, in terms of enhancing the defect quality (reduction of defects due to particles) of the formed thin film 2, it is preferable that, as described in the Structure 9, the thin film forming step be a step of rotating the transparent substrate 1 about a rotation axis passing through the center of the main surface and disposing a sputtering surface of a sputtering target at a position facing the main surface of the transparent substrate 1 and having an angle with respect to the main surface so that the rotation axis of the transparent substrate 1 and a straight line passing through the center of the sputtering surface and parallel to the rotation axis of the transparent substrate 1 are offset from each other, thereby forming the thin film 2 by sputtering. More specifically, it is preferable to use the sputtering apparatus of the oblique-incidence sputtering type disclosed in JP-A-2002-090978 and also shown in FIG. 2. In this case, it is necessary to adjust the target-substrate vertical distance (T/S) and the offset distance so that the formed thin film 2 has the thickness distribution of this invention. Preferably, the thin film forming step is carried out while rotating the transparent substrate 1. This is for forming the thin film 2 to be uniform in thickness and so on compared to a case where the transparent substrate 1 is not rotated. As a method of forming the thin film 2, it is possible to use DC sputtering, RF sputtering, or ion-beam sputtering. In particular, DC sputtering is preferable for the thin film forming step. This is because its film forming rate is high and thus it is excellent in productivity.

In this invention, as the thin film 2, there can be cited a semitransmissive film having a transmittance of 1% or more for exposure light as described in the Structure 2 or 10. As such a semitransmissive film, there can be cited, for example, a semitransmissive film with a phase difference of zero for manufacturing an enhancer mask or a semitransmissive film for manufacturing a phase shift mask which cannot obtain a phase difference large enough to produce a phase shift effect only by the semitransmissive film, but can obtain a phase difference large enough to produce a phase shift effect by digging down a substrate surface of a light-transmissive portion to a predetermined depth. When the thin film 2 is this semitransmissive film, the transmittance of the thin film 2 for exposure light is preferably 30% or less.

In this invention, as the thin film 2, there can be cited, as described in the Structure 3 or 11, a halftone phase shift film having a transmittance of 1% or more for exposure light and adapted to obtain a predetermined phase difference, that produces a phase shift effect, between exposure light transmitted through the thin film 2 and exposure light transmitted in air for a distance equal to the thickness of the thin film 2. When the thin film 2 is the halftone phase shift film, the transmittance of the thin film 2 for exposure light is preferably 30% or less. Further, when the thin film 2 is the halftone phase shift film, the phase difference that is produced when exposure light is transmitted through the thin film 2 is preferably in a range of 160 degrees to 200 degrees and more preferably in a range of 170 degrees to 190 degrees.

In this invention, when the thin film 2 is a light-shielding film of a binary mask, its thickness is preferably 65 nm or less and more preferably 55 nm or less. When the thin film 2 is a halftone phase shift film of a halftone phase shift mask, its thickness is preferably 75 nm or less and more preferably 70 nm or less. When the thin film 2 is a semitransmissive film of an enhancer mask, its thickness is preferably 40 nm or less and more preferably 30 nm or less.

In this invention, the thin film 2 is preferably such that an in-plane distribution of the transmittance is in a range of 0.6%, as described in the Structure 4 or 12. For example, when the transmittances of in-plane portions relative to a target transmittance value are in a range of +0.6% or in a range of −0.6% or when maximum and minimum transmittance values of in-plane portions relative to a target transmittance value are in a range of ±0.3%, the in-plane distribution of the transmittance is in a range of 0.6%. More preferably, in the thin film 2, the transmittances (maximum and minimum transmittance values) of in-plane portions relative to a target transmittance value are in a range of ±0.3%.

In this invention, the thin film 2 is preferably such that an in-plane distribution of the phase difference is in a range of 4 degrees, as described in the Structure 5 or 13. For example, when the phase differences of in-plane portions relative to a target phase difference value are in a range of +4 degrees or in a range of −4 degrees or when maximum and minimum phase difference values of in-plane portions relative to a target phase difference value are in a range of ±2 degrees, the in-plane distribution of the phase difference is in a range of 4 degrees. More preferably, in the thin film 2, the phase differences (maximum and minimum phase difference values) of in-plane portions relative to a target phase difference value are in a range of ±2 degrees.

A transfer mask according to this invention is characterized in that the thin film of the mask blank according to any of the Structures 1 to 5 is formed with a transfer pattern.

A method of manufacturing a transfer mask according to this invention comprises a pattern forming step of forming a transfer pattern in the thin film of the mask blank manufactured by the method of manufacturing a mask blank according to any of the Structures 6 to 13.

In this invention, a resist which is formed on the thin film 2 of the mask blank 3 when manufacturing a transfer mask from the mask blank 3 is preferably a chemically amplified resist. This is because it is suitable for high-accuracy processing. Further, the resist is preferably a resist for electron beam writing. This is because it is suitable for high-accuracy processing.

This invention is applied to a mask blank for electron beam writing which is formed with a resist pattern by electron beam writing.

In this invention, the transparent substrate 1 is not particularly limited as long as it has transparency at an exposure wavelength to be used. In this invention, it is possible to use, as the transparent substrate 1, a quartz substrate or any of various other glass substrates (e.g. $CaF_2$ substrate, soda-lime glass, alkali-free glass substrate, aluminosilicate glass, etc.). Among them, the quartz substrate is particularly suitable for this invention because it has high transparency in the wavelength region of ArF excimer laser.

In this invention, the transfer mask may be a phase shift mask or a binary mask which does not use a phase shift effect. The transfer mask may be a reticle. The phase shift mask may be a phase shift mask of the halftone type (tritone type) or the like, or an enhancer mask.

In this invention, in addition to the semitransmissive film and its pattern, it is possible to form another thin film and its pattern. For example, in the case of a structure having a light-shielding film above or below the semitransmissive film, since the material of the semitransmissive film contains a transition metal silicide, the material of the light-shielding film may be made of chromium having etching selectivity (etching resistance) to the semitransmissive film or a chromium compound in which an element such as oxygen, nitrogen, or carbon is added to chromium. By this, it is possible to form a light-shielding film pattern above or below a light-semitransmissive film pattern. This material containing chromium may be chromium (Cr) alone or a material containing chromium (Cr) and one or more elements such as nitrogen (N), oxygen (O), carbon (C), hydrogen (H), and helium (He). For example, it may be Cr, CrN, CrO, CrNO, CrNC, CrCON, or the like, or a material containing hydrogen (H) or helium (He) in addition thereto.

In this invention, it is possible to use, for example, a fluorine-based gas, such as $SF_6$, $CF_4$, $C_2F_6$, or $CHF_3$, or a mixed gas of such a fluorine-based gas and He, $H_2$, $N_2$, Ar, $C_2H_4$, $O_2$, or the like for dry-etching the thin film 2 containing a transition metal and silicon. For dry-etching the chromium-based thin film, it is possible to use a dry etching gas in the form of a mixed gas containing a chlorine-based gas and an oxygen gas. As the chlorine-based gas for use in the dry etching, there can be cited, for example, $Cl_2$, $SiCl_4$, HCl, $CCl_4$, $CHCl_3$, or the like.

In the meantime, in the mask blank 3 of this invention, the thin film 2 for transfer pattern formation provided on the transparent substrate 1 is made of a material containing a transition metal and silicon and further containing at least one of oxygen and nitrogen. However, even if a material composed of silicon and nitrogen or a material containing a material composed of silicon and nitrogen and one or more elements selected from semi-metal elements, non-metal elements, and a rare gas is used as a material forming the thin film 2 for transfer pattern formation of this invention, the structure of the thin film 2 for transfer pattern formation of this invention can be applied thereto and the same effect can be obtained.

A specific structure is a mask blank 3 comprising a thin film 2 for transfer pattern formation on a main surface of a transparent substrate 1, wherein the thin film 2 is made of a material composed of silicon and nitrogen or a material containing a material composed of silicon and nitrogen and one or more elements selected from semi-metal elements, non-metal elements, and a rare gas, wherein the thin film 2 has as its surface layer an oxide layer 22 with an oxygen content higher than that of a region 21, other than the surface layer, of the thin film, wherein the thin film 2 is formed so that the thickness of its central portion is greater than that of its outer peripheral portion on the main surface side, and wherein the oxide layer 22 is formed so that the thickness of its central portion is greater than that of its outer peripheral portion on the main surface side.

Even in the case of the thin film for transfer pattern formation to which the material composed of silicon and nitrogen, or the like is applied, although not so much as in the case of the thin film 2 for transfer pattern formation of this invention containing the transition metal which is an element with a high refractive index and a high extinction coefficient, the thickness distribution of the oxide layer which is formed as the surface layer of the thin film is not uniform due to heating and cooling treatments so that there occurs a reduction in the uniformity of the transmittance distribution and the phase shift amount distribution of the entire thin film. Therefore, even in the case of the thin film for transfer pattern formation to which the material composed of silicon and nitrogen, or the like is applied, it is possible to enhance the uniformity of the transmittance distribution and the phase shift amount distribution of the entire thin film by setting the thicknesses of the thin film 2 and the oxide layer 22 as defined in this invention.

Likewise, even in the case where, in the mask blank manufacturing method of this invention, the thin film forming step is replaced with a step of forming a thin film 2 by sputtering using a silicon target or a target made of a material containing silicon and one or more elements selected from semi-metal elements and non-metal elements in a sputtering gas containing a nitrogen-based gas and a rare gas, it is possible to obtain the same effect as that obtained by the mask blank manufacturing method of this invention.

A specific structure is a method of manufacturing a mask blank 3 comprising a thin film 2 for transfer pattern formation on a main surface of a transparent substrate 1, comprising a thin film forming step of forming, on the main surface of the transparent substrate 1, the thin film 2 by sputtering using a silicon target or a target made of a material containing silicon and one or more elements selected from semi-metal elements and non-metal elements in a sputtering gas containing a nitrogen-based gas and a rare gas, and a heating/cooling step of carrying out, in a gas containing oxygen, a heat treatment and a forcible cooling treatment for the thin film 2 formed in the thin film forming step, wherein the thin film forming step is a step of forming the thin film 2 so that the thickness of its central portion is greater than that of its outer peripheral portion on the main surface side and wherein the heating/cooling step is a step of forming, as a surface layer of the thin film 2, an oxide layer 22 with an oxygen content higher than that of a region 21, other than the surface layer, of the thin film 2 and is a step of forming the oxide layer 22 so that the thickness of its central portion is greater than that of its outer peripheral portion on the main surface side.

The semi-metal element to be contained in the thin film 2 is not particularly limited. If, among the semi-metal elements, one or more elements selected from boron, germanium, antimony, and tellurium are to be contained, the selected semi-metal element/elements can be contained in silicon for use as the sputtering target so that the conductivity of the target can be expected to be enhanced, which is thus preferable. Any sputtering method can be applied to the thin film forming step in this mask blank manufacturing method. Since the conductivity of the target is lower than that in the case of the thin film containing the transition metal, it is preferable to use RF sputtering or ion-beam sputtering.

Any non-metal element may be contained in the thin film 2. Among the non-metal elements, one or more elements selected from carbon, fluorine, and hydrogen are preferably contained. As the nitrogen-based gas used in the thin film forming step, any gas can be used as long as it is a gas containing nitrogen. Since the oxygen content of the thin film 2 before the formation of the oxide layer 22 is preferably suppressed to be low, it is preferable to use a nitrogen-based gas containing no oxygen and more preferable to use a nitrogen gas. As the rare gas used in the thin film forming step, any rare gas can be used. However, in terms of the film forming rate, it is preferable to use argon, krypton, or xenon. On the other hand, in terms of reducing the stress of the thin film 2 to be formed, it is preferable to use helium or neon having a small atomic weight and to positively allow it to be taken into the thin film 2.

The other structures of the mask blank having the thin film made of the material containing no transition metal and the method of manufacturing such a mask blank are the same as those of the mask blank 3 of this invention and the method of manufacturing the mask blank 3 of this invention. Further, a transfer mask which is manufactured using the mask blank having the thin film made of the material containing no transition metal and a method of manufacturing such a transfer mask are also the same as the transfer mask of this invention and the transfer mask manufacturing method of this invention.

EXAMPLE

Hereinafter, this invention will be described in further detail with reference to an Example.

Example 1

Using a synthetic quartz glass substrate having a main surface of a square shape of about 152 mm×about 152 mm with a thickness of about 6.25 mm as a transparent substrate 1, a semitransmissive film (thin film) 2 made of molybdenum, silicon, and nitrogen was formed on the transparent substrate 1. For forming the semitransmissive film 2, use was made of the DC sputtering apparatus of the so-called oblique-incidence sputtering type and single-wafer processing type shown in FIG. 2. Specifically, using a mixed target of molybdenum (Mo) and silicon (Si) (Mo:Si=12 at %:88 at %), reactive sputtering (DC sputtering) was carried out in a mixed gas atmosphere of argon (Ar), nitrogen ($N_2$), and helium (He) (gas flow rate ratio Ar:$N_2$:He=8:72:100), thereby forming a MoSiN film (phase shift film) 2 made of molybdenum, silicon, and nitrogen on the transparent substrate 1. In this event, the film forming conditions (various conditions, i.e. T/S distance, offset distance, and sputtering voltage) of the DC sputtering apparatus were set so that the average thickness of the semitransmissive film 2 to be formed would be 69 nm and that the thickness of its central portion would be greater by about 18 Å than that of its outer peripheral portion. Herein, the boundary between the central portion and the outer peripheral portion of the thin film 2 to be formed was set to a square shape with a side of 132 mm with respect to the center of the synthetic quartz glass substrate 1. A region inside the boundary was given as the central portion while a region outside the boundary was given as the outer peripheral portion. Herein, the film forming conditions were set so that the phase shift film (phase shift film at the completion of a mask blank 3) 2 after the formation of an oxide layer 22 would have a transmittance of 6% for ArF excimer laser exposure light with a wavelength of 193 nm and would produce a phase shift amount of 177 degrees for the exposure light.

With respect to the formed MoSiN film (phase shift film) 2, the transmittance and the phase shift amount for light of a wavelength of 193 nm being the wavelength of ArF excimer laser were respectively measured at the central portion of the thin film 2 (the center of the main surface of the transparent substrate) using a phase shift amount measurement apparatus (MPM193 manufactured by Lasertec Corporation). As a result, the transmittance was 4.52% and the phase shift amount was 182.5 degrees. Further, the thickness at the center of the main surface of the transparent substrate 1 was measured as the thickness of the central portion of the phase shift film 2 by an X-ray reflectivity method (XRR) and it was 702 Å. As the average thickness of the outer peripheral portion of the phase shift film 2, the thicknesses of the outer peripheral portion near four corners of the boundary square shape were measured by the X-ray reflectivity method (XRR) and the average value was calculated to be 684 Å. In the measurement by the X-ray reflectivity method, GXR300RD manufactured by Rigaku Corporation was used.

Figure 3:
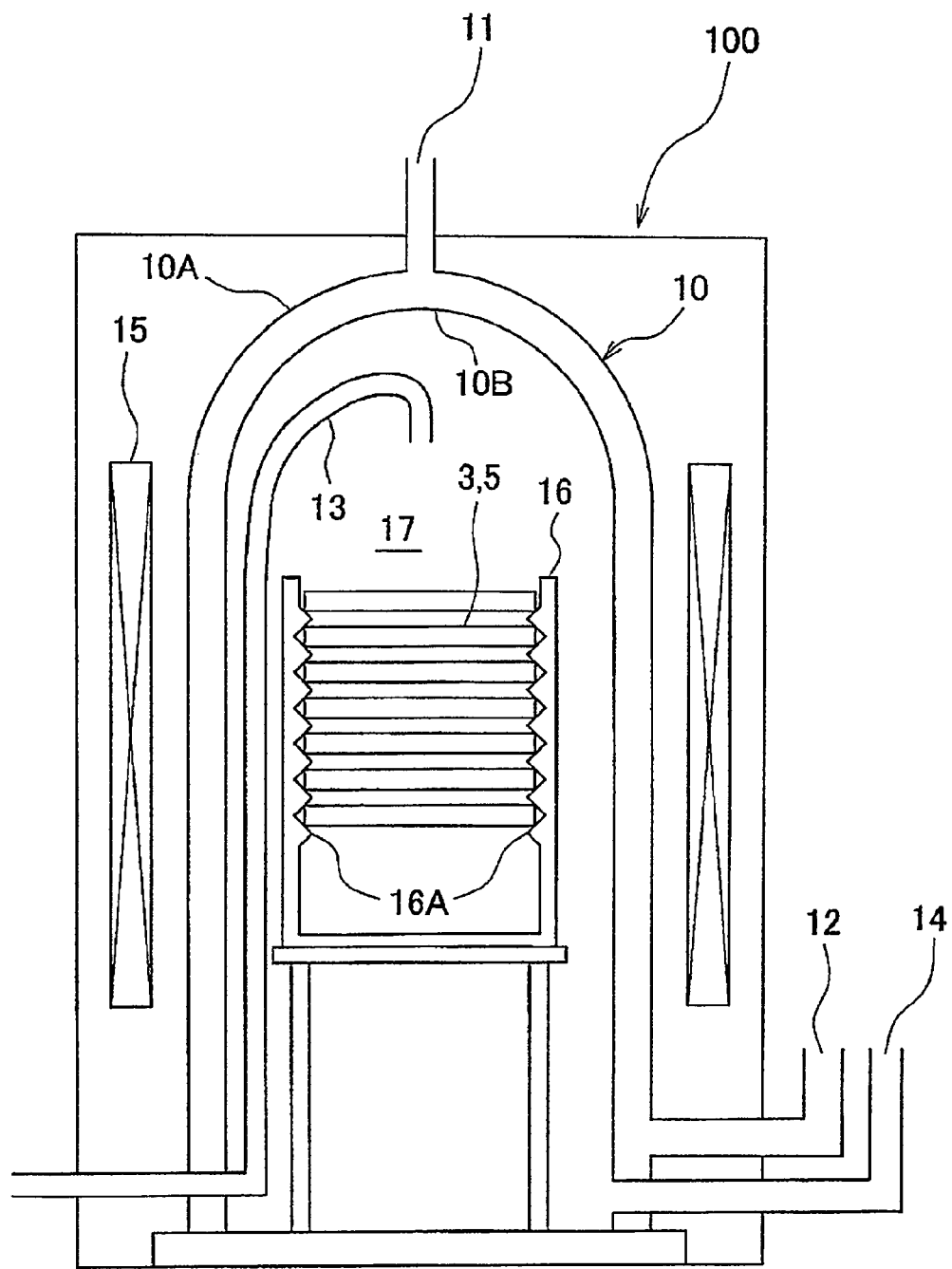
FIG. 3 is an exemplary diagram of a vertical furnace for use in a heat treatment and a forcible cooling treatment.
Figure 4:
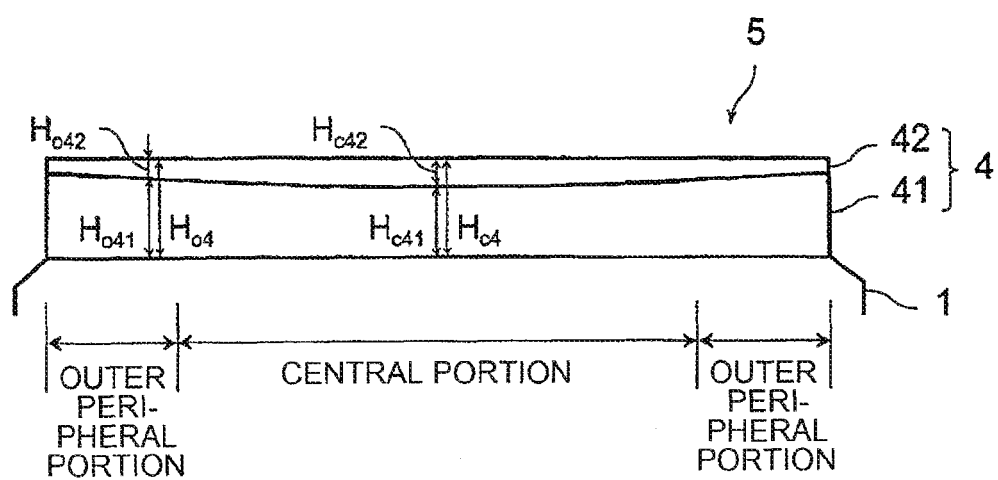
FIG. 4 is an exemplary cross-sectional view of a mask blank after carrying out a heat treatment and a forcible cooling treatment for a thin film with a conventional thickness distribution.

Then, five transparent substrates 1 each formed with the MoSiN film (phase shift film) 2, which were prepared in the same manner as described above, were placed on the substrate support portions 16A in tiers of the quartz board 16 of the vertical furnace 100 of FIG. 3 so as to be stacked vertically at an interval from each other. Herein, transparent substrates (dummy substrates) each formed with no phase shift film 2 were placed on the uppermost-tier and lowermost-tier substrate support portions 16A. This is because the uppermost tier and the lowermost tier tend to be affected by disturbance or the like so that it is difficult to control the thickness of the oxide layer 22. A heat treatment for the thin films 2 was carried out for 1 hour from when the temperature in the heating/cooling chamber 17 had reached 450° C. due to heating by the heater (heating apparatus) 15. Then, a coolant started to be introduced from the coolant inlet pipe 11 immediately after stopping the heating by the heater 15, thereby forcibly cooling the inside of the heating/cooling chamber 17 to an ordinary temperature. In this manner, a forcible cooling treatment for the thin films 2 was carried out. By these heat treatment and forcible cooling treatment, the oxide layer 22 was formed as a surface layer of each MoSiN film (phase shift film).

With respect to the five transparent substrates each having the phase shift film 2 after the forcible cooling treatment, the transmittance and the phase shift amount for light of a wavelength of 193 nm were measured in the same manner as described above. The measurement results at the central portions of the thin films 2 (the centers of the main surfaces of the transparent substrates) were such that the transmittance was 6.16% in average and the phase shift amount was 178.1 degrees in average. Further, the transmittance and the phase shift amount were measured in the same manner as described above at the four positions, where the thickness was measured before the formation of the oxide layer 22, of the outer peripheral portion of each phase shift film. Then, the average value of the transmittances and the average value of the phase shift amounts were calculated. As a result, the average transmittance was 6.07% and the average phase shift amount was 177.3 at the outer peripheral portions of the phase shift films 2. Further, in each of the five transparent substrates 1 each having the phase shift film 2 after the forcible cooling treatment, the measured transmittance values were in a range of ±0.3% from the design transmittance of 6% both at the central portion and the outer peripheral portion of the thin film. Simultaneously, in each of the five mask blanks 3, the measured phase shift amount values were in a range of ±2 degrees from the design phase shift amount of 177 degrees both at the central portion and the outer peripheral portion of the phase shift film 2.

Further, with respect to each of the transparent substrates 1 each having the phase shift film 2 after the forcible cooling treatment, the thickness of the oxide layer 22 was measured by the X-ray reflectivity method (XRR). As a result, the thickness of the oxide layer 22 was greater at the central portion of the phase shift film 2 than at the outer peripheral portion thereof. Further, the difference between the thicknesses of the outer peripheral portion and the central portion of the oxide layer 22 was 15 Å in average.

Comparative Example 1

A semitransmissive film (thin film) 4 made of molybdenum, silicon, and nitrogen was formed on a transparent substrate 1 in the same manner as in Example 1. However, in this Comparative Example, when forming the semitransmissive film by the DC sputtering apparatus, the film forming conditions were applied so that the thickness of the film would be as uniform as possible on the main surface side. Therefore, in the MoSiN film (phase shift film) 4 formed on the transparent substrate 1, the thickness difference between its outer peripheral portion and its central portion was about 5 Å, which was significantly small compared to Example 1. In the same manner as described above, five transparent substrates 1 each formed with the MoSiN film (phase shift film) 4 of Comparative Example 1 were prepared. Further, under the same conditions as in Example 1, a heat treatment and a forcible cooling treatment were carried out for the five transparent substrates each having the phase shift film 4 of Comparative Example 1. By carrying out these heat treatment and forcible cooling treatment, an oxide layer 42 was formed as a surface layer of each MoSiN film (phase shift film) 4.

With respect to the five transparent substrates each having the phase shift film 4 after the forcible cooling treatment, the transmittance and the phase shift amount for light of a wavelength of 193 nm were measured in the same manner as described above. The measurement results at the central portions of the thin films 4 (the centers of the main surfaces of the transparent substrates 1) were such that the transmittance was 6.44% and the phase shift amount was 174.3 degrees. Further, the transmittance and the phase shift amount were measured in the same manner as described above at four positions, where the thickness was measured before the formation of the oxide layer 42, of the outer peripheral portion of each phase shift film 4. Then, the average value of the transmittances and the average value of the phase shift amounts were calculated. As a result, the average transmittance was 5.72% and the average phase shift amount was 180.1 at the outer peripheral portions of the phase shift films 4. Further, in each of the five transparent substrates 1 each having the phase shift film 4 after the forcible cooling treatment, the measured transmittance values were outside a range of ±0.3% from the design transmittance of 6% both at the central portion and the outer peripheral portion of the thin film 4. Simultaneously, in each of the five mask blanks 5, the measured phase shift amount values were outside a range of ±2 degrees from the design phase shift amount of 177 degrees both at the central portion and the outer peripheral portion of the phase shift film 4.

(Manufacture of Phase Shift Mask)

A light-shielding film made of a material containing chromium was formed on the phase shift film 2 of the phase shift mask blank 3 manufactured in Example 1 described above, thereby manufacturing a phase shift mask blank having the light-shielding film. The formed light-shielding film had a structure in which a CrCON film (thickness 30 nm), a CrN film (thickness 4 nm), and a CrOCN film (thickness 14 nm) were laminated in this order from the phase shift film 2 side. The optical density was 3.1 at the wavelength (193 nm) of ArF excimer laser in the form of the laminated structure of the phase shift film 2 made of MoSiN and the light-shielding film made of the Cr-based materials.

A halftone phase shift mask was manufactured using the manufactured phase shift mask blank having the light-shielding film. Specifically, first, a chemically amplified positive resist film for electron beam writing (PRL009 manufactured by FUJIFILM Electronic Materials Co., Ltd.) was formed as a resist film on the light-shielding film of the mask blank. The resist film was formed by spin coating using a spinner (spin coating apparatus).

Then, using an electron beam writing apparatus, a transfer pattern to be formed in the phase shift film was written on the resist film formed on the mask blank and, thereafter, the resist film was developed with a predetermined developer, thereby forming a resist pattern.

Subsequently, using the resist pattern as a mask, the light-shielding film was etched to form a light-shielding film pattern. A mixed gas of $Cl_2$ and $O_2$ was used as a dry etching gas.

Then, using the resist pattern or the light-shielding film pattern as a mask, the phase shift film was etched to form a phase shift pattern. A mixed gas of $SF_6$ and He was used as a dry etching gas.

Then, the remaining resist pattern was removed and a chemically amplified positive resist film for electron beam writing (PRL009 manufactured by FUJIFILM Electronic Materials Co., Ltd.) was newly formed by spin coating. Further, using an electron beam writing apparatus, a transfer pattern (light-shielding band or the like) to be formed in the light-shielding film was written on the formed resist film and, thereafter, the resist film was developed with a predetermined developer, thereby forming a resist pattern.

Then, using this resist pattern as a mask, the light-shielding film was etched to form a pattern of the light-shielding band or the like. Finally, the remaining resist pattern was removed and a predetermined cleaning treatment was carried out, thereby obtaining a phase shift mask. This phase shift mask had high in-plane uniformity in the transmittance and phase difference of the phase shift pattern and thus was capable of carrying out exposure transfer with high accuracy.

REFERENCE SIGNS LIST 1 transparent substrate
2, 4 thin film
22, 42 oxide layer
3, 5 mask blank
10 quartz tube
11 coolant inlet pipe
12 coolant outlet pipe
15 heater (heating apparatus)

16 quartz board
17 heating/cooling chamber
100 vertical furnace

The invention claimed is:

1. A mask blank comprising a thin film for transfer pattern formation on a main surface of a transparent substrate,
   wherein the thin film is made of a material containing a transition metal and silicon and further containing at least one of oxygen and nitrogen,
   wherein the thin film has as its surface layer an oxide layer with an oxygen content higher than that of a region, other than the surface layer, of the thin film,
   wherein the thin film is formed so that a thickness of its central portion is greater than that of its outer peripheral portion on the main surface side, and
   wherein the oxide layer is formed so that a thickness of its central portion is greater than that of its outer peripheral portion on the main surface side.

2. The mask blank according to claim 1, wherein the thin film is a semitransmissive film having a transmittance of 1% or more for exposure light.

3. The mask blank according to claim 1, wherein the thin film is a halftone phase shift film having a transmittance of 1% or more for exposure light and adapted to produce a phase difference between exposure light transmitted through the thin film and exposure light transmitted in air for a distance equal to the thickness of the thin film.

4. The mask blank according to claim 2, wherein the thin film is such that an in-plane distribution of the transmittance is in a range of 0.6%.

5. The mask blank according to claim 3, wherein the thin film is such that an in-plane distribution of the phase difference is in a range of 4 degrees.

6. A transfer mask, wherein the thin film of the mask blank according to claim 1 is formed with a transfer pattern.

* * * * *